(12) United States Patent
Shibayama et al.

(10) Patent No.: US 7,893,742 B2
(45) Date of Patent: Feb. 22, 2011

(54) CLOCK SIGNAL DIVIDING CIRCUIT

(75) Inventors: Atsufumi Shibayama, Tokyo (JP);
 Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 100 days.

(21) Appl. No.: 12/514,115

(22) PCT Filed: Oct. 26, 2007

(86) PCT No.: PCT/JP2007/070949

§ 371 (c)(1),
(2), (4) Date: May 8, 2009

(87) PCT Pub. No.: WO2008/056551

PCT Pub. Date: May 15, 2008

(65) Prior Publication Data

US 2010/0052753 A1    Mar. 4, 2010

(30) Foreign Application Priority Data

Nov. 10, 2006   (JP) .............................. 2006-305075

(51) Int. Cl.
 *H03L 7/00* (2006.01)
(52) U.S. Cl. .................. 327/161; 327/117; 327/115
(58) Field of Classification Search ................ 327/141, 327/161, 115, 117
See application file for complete search history.

(56) References Cited

U.S. PATENT DOCUMENTS 6,987,408 B2 * 1/2006 Kim ........................... 327/158
7,403,054 B1 * 7/2008 Malladi et al. .............. 327/158
7,511,542 B2 * 3/2009 Furukawa ................... 327/115
7,629,827 B2 * 12/2009 Fukuoka et al. ............. 327/295

FOREIGN PATENT DOCUMENTS

| JP | 2001251181 A | 9/2001 |
|---|---|---|
| JP | 2002057578 A | 2/2002 |
| JP | 2002158566 A | 5/2002 |
| JP | 2005045507 A | 2/2005 |
| JP | 2006148807 A | 6/2006 |

OTHER PUBLICATIONS

International Search Report for PCT/JP2007/070949 mailed Dec. 18, 2007.

* cited by examiner

*Primary Examiner*—Hai L Nguyen

(57) ABSTRACT

A clock signal dividing circuit in which a dividing ratio is regulated by N/M (M and N are positive integers and satisfy M>N) includes: a variable delay circuit which gives a predetermined delay amount based on a control value to an input clock signal CKI to output an output clock signal CKO; and a variable delay control circuit which cumulatively adds values obtained by subtracting N from M every cycle of the input clock signal CKI, when the addition result is N or more, performs a calculation which subtracts N from the addition result to obtain a calculation result K, and calculates, to a maximum delay amount in the variable delay circuit corresponding to one cycle of the input clock signal CKI, a control value corresponding to a delay amount of K/N of the maximum delay amount to give the control value to the variable delay circuit.

12 Claims, 12 Drawing Sheets

F I G. 1
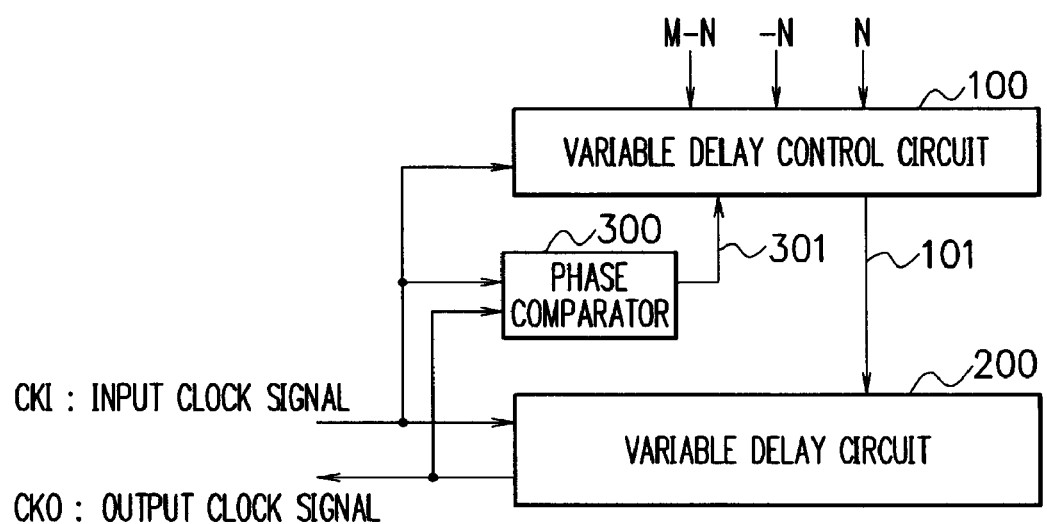

F I G. 3
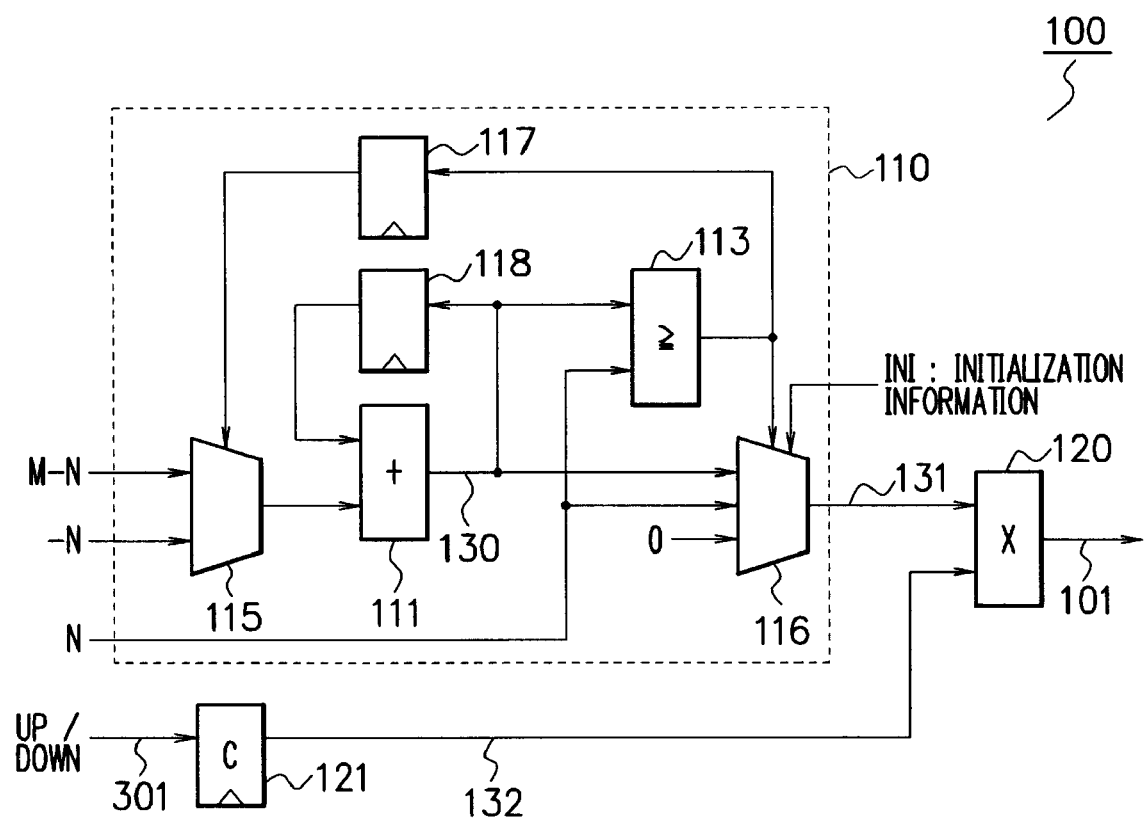

F I G. 5
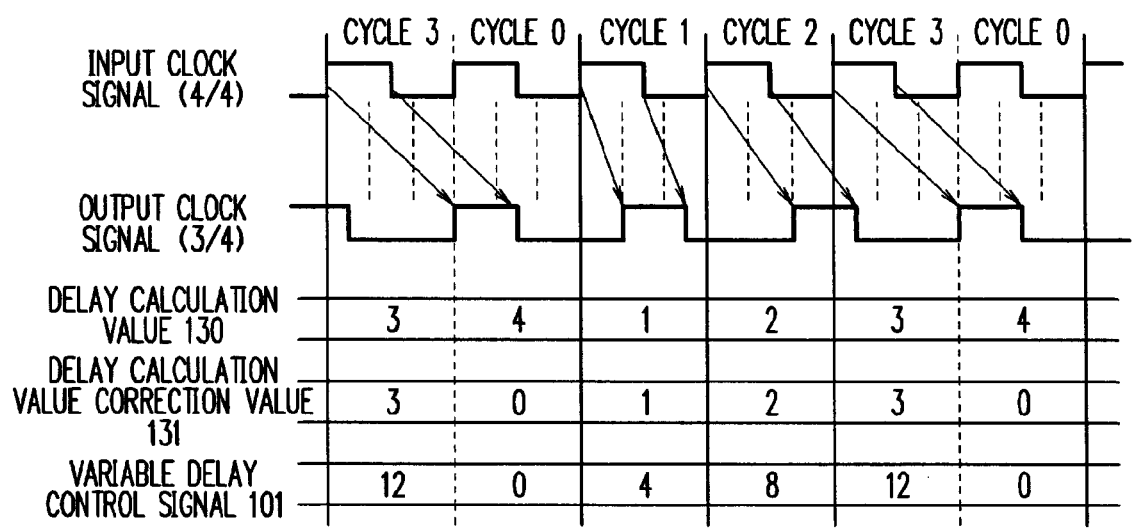

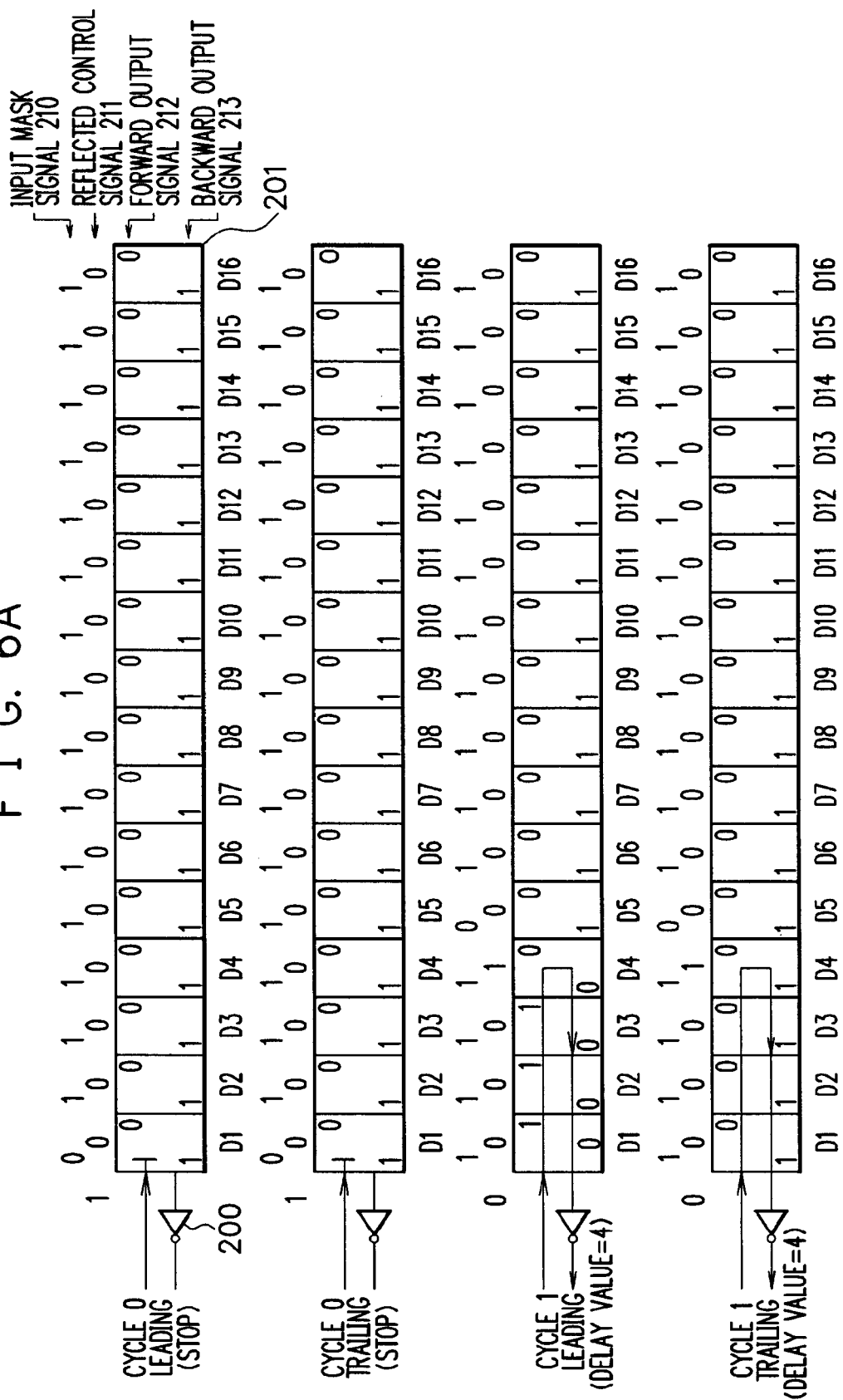

F I G. 7
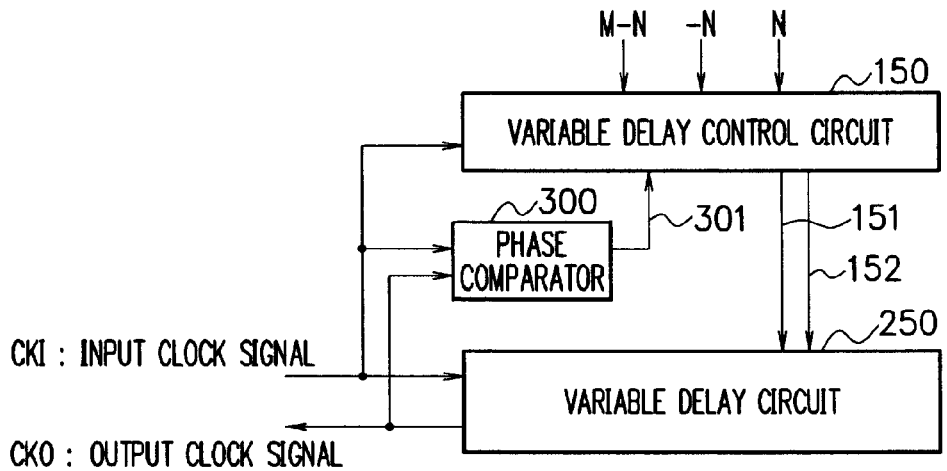
F I G. 8
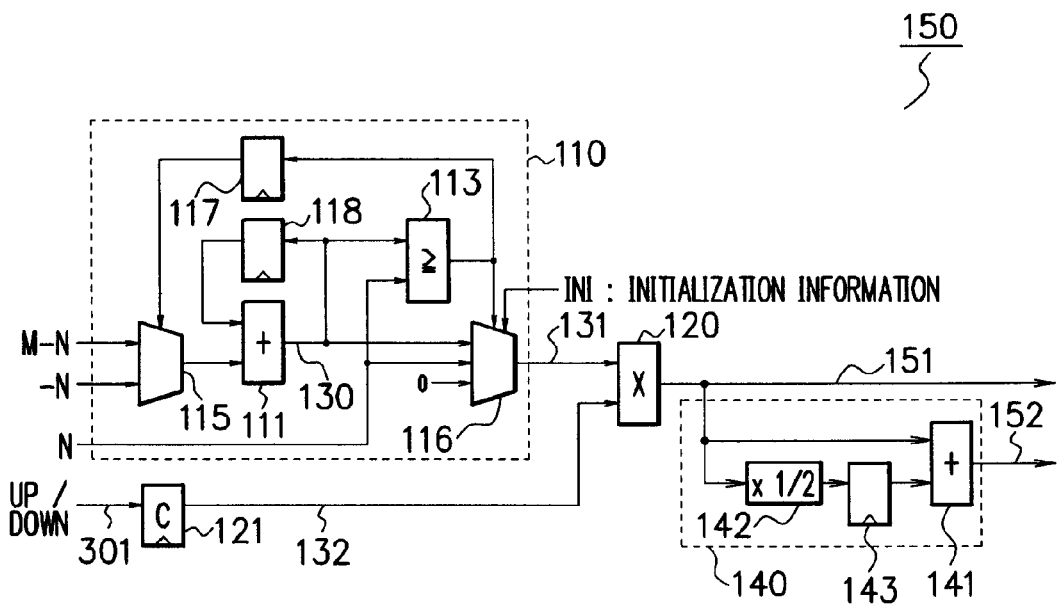

F I G. 10
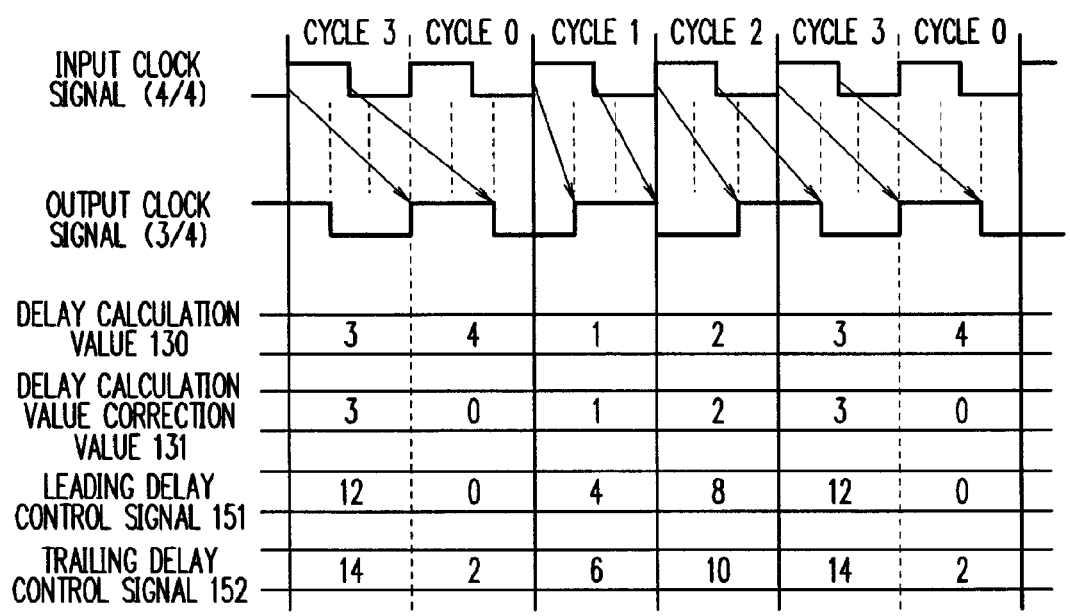

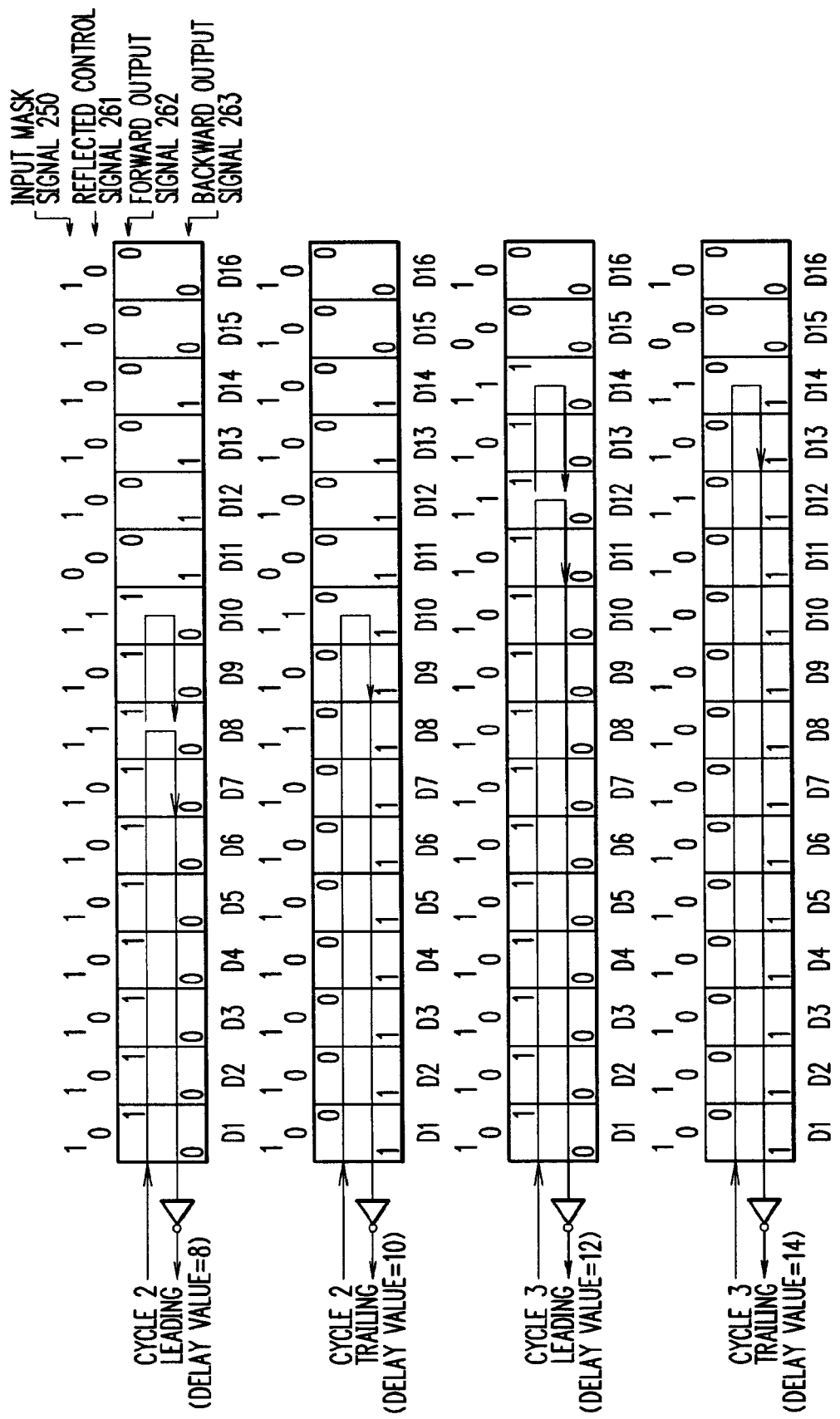

CLOCK SIGNAL DIVIDING CIRCUIT

This application is the National Phase of PCT/JP2007/070949, filed Oct. 26, 2007, which claims priority to Japanese Patent Application No. 2006-305075, filed on Nov. 10, 2006, which is incorporated herein by reference in its entirety.

TECHNICAL FIELD

The present invention relates to a clock signal dividing circuit and, in particular, to a clock signal dividing circuit which divides a clock signal by an arbitrary rational number.

BACKGROUND ART

In a clock signal dividing circuit which divides a clock signal having a frequency to generate a clock signal having a lower frequency, there can be realized a dividing circuit (integer dividing circuit) in which a dividing ratio, i.e., a ratio of a frequency of a clock signal obtained before frequency dividing to a frequency of a clock signal obtained after the frequency dividing is 1/M (M is a positive integer) by using a counter circuit.

On the other hand, a dividing circuit (rational number dividing circuit) which can perform frequency dividing even though a dividing ratio is N/M (N and M are positive integers) is proposed in the past (for example, see Patent Documents 1 and 2). According to the conventional art, values (value N in the dividing ratio N/M) each of which sets a numerator of the dividing ratio are cumulatively added every cycle of an input clock signal. When the addition result is larger than a value (value M in the dividing ratio N/M) which sets a denominator of the dividing ratio, an operation which subtracts M from the addition result is performed, and pulses of the input clock signal are arbitrarily thinned out with reference to the addition result to realize rational number dividing.

As a conventional art, a clock generating circuit using a phase interpolator is proposed (for example, see Patent Document 3). According to the art described in Patent Document 3, an edge is generated by the phase interpolator at a timing except for an edge of an input clock signal to make it possible to generate a rational number divided clock signal having a constant cycle time.

Patent Document 1: Japanese Patent Application Laid-Open No. 2005-45507
Patent Document 2: Japanese Patent Application Laid-Open No. 2006-148807
Patent Document 3: Japanese Patent Application Laid-Open No. 2002-57578

DISCLOSURE OF THE INVENTION

Problem to be Solved by the Invention

In the clock dividing circuits described in Patent Documents 1 and 2, frequency dividing is realized by selectively thinning out a pulse of an input clock signal. For this reason, a timing of a pulse output of a divided clock signal is limited to a timing of the pulse of the input clock signal. As a result, a cycle time of the divided clock signal considerably fluctuates depending on cycles. Since the minimum value of the cycle time does not decrease in proportion to a dividing ratio, limitation of a maximum delay of a circuit driven by the divided clock signal cannot be moderated depending on frequencies.

In the clock dividing circuit described in Patent Document 3, a rational number divided clock signal having a constant cycle time can be generated by a phase interpolator. However, the phase interpolator requires a large capacity when an input clock signal having a relatively low frequency, for example, an input clock signal having a frequency of 500 MHz or less is divided. For this reason, a high power consumption, a large layout area, and low resistance to noise are posed as problems. For this reason, the clock dividing circuit requires a single-purpose design an analog circuit, design and verification costs are disadvantageously large.

The present invention has been made in consideration of the above problems, and has as its object to provide a rational number dividing circuit which has a constant cycle time of a divided clock signal, a low power consumption, a small layout area, and a low design/verification cost.

Means for Solving the Problems

A clock signal dividing circuit according to one aspect of the present invention in which a dividing ratio is regulated by N/M (M and N are positive integers and satisfy M>N), includes: a variable delay circuit which gives a predetermined delay amount based on a control value to an input clock signal to output an output clock signal; and a variable delay control circuit which cumulatively adds values obtained by subtracting N from M every cycle of the input clock signal, when the addition result is not less than N, performs a calculation which subtracts N from the addition result to obtain a calculation result K, and calculates, to a maximum delay amount in the variable delay circuit corresponding to one cycle of the input clock signal, a control value corresponding to a delay amount of K/N of the maximum delay amount to give the control value to the variable delay circuit.

The clock signal dividing circuit according to the present invention may further include a phase comparator which compares a phase difference between the input clock signal and output clock signal, wherein the variable delay control circuit may calculate a maximum delay amount based on a comparison result of the phase comparator in an initialization state to store the maximum delay amount.

In the clock signal dividing circuit according to the present invention, the variable delay control circuit may periodically correct a predetermined delay amount which is based on the control value based on a comparison result of the phase comparator in a frequency dividing operation state.

In the clock signal dividing circuit according to the present invention, the variable delay circuit may include a plurality of delay units, and the number of delay units through which the input clock signal passes may be changed based on the control value to control a predetermined delay amount.

In the clock signal dividing circuit according to the present invention, the delay unit may include a first delay element which transmits the input clock signal in a forward direction, a second delay element which transmits the input clock signal in a backward direction, and a bypass circuit which makes an output from the first delay element connectable to an input of the second delay element, and the variable delay circuit may activate only a bypass circuit included in a delay unit selected based on the control value.

In the clock signal dividing circuit according to the present invention, the variable delay circuit may control the first delay element included in a delay unit connected to the selected delay unit in the forward direction to be disconnected from a transmission route of the input clock signal.

In the clock signal dividing circuit according to the present invention, the variable delay circuit is a circuit which outputs an output signal by a logical operation between a first delay signal which gives a first delay amount based on a first control value to the input clock signal and a second delay signal which gives a second delay amount based on a second control value to the input clock signal, the first control value is a control value corresponding to a delay amount of K/N of the maximum delay amount, and the variable delay control circuit may further include a delay correction circuit which adds a predetermined value to the first control value to give an addition value to the variable delay circuit as the second control value.

In the clock signal dividing circuit according to the present invention, the variable delay circuit may include a plurality of delay units, and the number of delay units through which the input clock signal passes may be changed based on the first and second control values to control the first and second delay mounts.

In the clock signal dividing circuit according to the present invention, the delay unit may include a first delay element which transmits an input clock signal in a forward direction, a second delay element which transmits the input clock signal in a backward direction, and a bypass circuit which makes an output of the first delay element connectable to an input of the second delay element, and the variable delay circuit activates a bypass circuit included in the first delay unit selected based on the first control value and a bypass circuit included in the second delay unit selected based on the second control value and, at the input of the second delay element included in the first delay unit, may perform a logical operation by an output from the bypass circuit included in the first delay unit and an output from the second delay element included in the delay unit located at a previous stage of the first delay unit in a backward direction.

In the clock signal dividing circuit according to the present invention, the variable delay circuit may disconnect the first delay element included in the delay unit subsequent to the second delay unit in the forward direction from a transmission route of the input clock signal.

In the clock signal dividing circuit according to the present invention, the predetermined value may be a control value corresponding to a delay amount obtained by multiplying a maximum delay amount by (M−N)/(2N).

In the clock signal dividing circuit according to the present invention, the first control value may be a control value to a first edge of the input clock signal, and the second control value may be a control value to a second edge opposing the first edge of the input clock signal.

Effect Of The Invention

According to the present invention, there can be provided a rational number dividing circuit which has a constant cycle time of a divided clock signal, a low power consumption, a small layout area, and a low design/verification cost.

BEST MODE FOR CARRYING OUT THE INVENTION

A clock signal dividing circuit according to an exemplary embodiment of the present invention in which a dividing ratio is regulated by N/M which is a ratio of two positive integers N and M includes: a variable delay circuit (200 in FIG. 1) which gives a predetermined delay amount to an input clock signal (CKI in FIG. 1) to output a clock signal; a phase comparator (300 in FIG. 1) which compares phase differences between the input clock signal and the output clock signal (CKO in FIG. 1) output from the variable delay circuit; and a variable delay control circuit (100 in FIG. 1) which generates a control value which controls a delay amount of the variable delay circuit, and the variable delay control circuit controls a delay amount of the variable delay circuit every cycle of the input clock signal in units of 1/N of one cycle of an input clock.

The variable delay circuit preferably includes a plurality of delay units (201 in FIG. 2), and the number of delay units through which an input clock signal passes is preferably changed based on the control value given by the variable delay control circuit to control a delay amount to be added to the input clock signal.

The variable delay control circuit is characterized in that values obtained by subtracting the integer N from the integer M which regulate a dividing ratio are cumulatively added every cycle of the input clock signal, and when the addition result is larger than the integer N, an operation which subtracts the integer N from the addition result is performed. The control value is preferably generated based on the addition result.

The variable delay control circuit preferably includes storage means which stores a control value which sets a delay amount of the variable delay circuit to a delay equal to one cycle of the input clock signal, and the variable delay control circuit preferably generates a control value which controls a delay amount of the variable delay circuit based on the control value which sets the delay amount of the variable delay circuit to the delay equal to one cycle of the input clock signal.

Furthermore, the variable delay control circuit preferably calculates the control value which is stored by the variable delay control circuit and which sets the delay amount of the variable delay circuit to the delay equal to one cycle of the input clock signal based on a phase comparison result output from the phase comparator. The exemplary embodiments will be described below with reference to the accompanying drawings.

First Exemplary Embodiment

FIG. 1 is a block diagram showing a configuration of a clock signal dividing circuit according to a first exemplary embodiment of the present invention. In FIG. 1, the clock signal dividing circuit includes a variable delay control circuit 100, a variable delay circuit 200, and a phase comparator 300, and divides an input clock signal CKI at a dividing ratio N/M (M and N are positive integers and satisfy M>N) to output an output clock signal CKO.

The variable delay control circuit 100 operates at a timing of the input clock signal CKI and generates a variable delay control signal 101 with reference to set signals M−N, −N, and N of the dividing ratio and a phase comparison result signal 301. More specifically, the set signals M−N, −N, and N of the dividing ratio are input to calculate a delay control value of the variable delay circuit 200 in each cycle of the input clock signal CKI. Based on the calculated value, the delay amount of the variable delay circuit 200 is controlled every cycle of the input clock signal CKI in units of 1/N of one cycle of the input clock signal CKI.

The variable delay circuit 200 adds a delay of a delay amount which is in proportion to the delay control value given by the variable delay control signal 101 to the input clock signal CKI, and outputs the signal as the output clock signal CKO. When the delay control value is 0, the output clock signal CKO is not output.

The phase comparator 300 periodically compares phase differences between leading edges of the input clock signals CKI and the output clock signals CKO in an initial state to output the result as a phase comparison result signal 301. At this time, when a phase of the output clock signal CKO is delayed with reference to a phase of the input clock signal CKI, a UP request is output to the phase comparison result signal 301. When the phase of the output clock signal CKO advances with reference to the phase of the input clock signal CKI, a DOWN request is output to the phase comparison result signal 301.

A configuration of the variable delay control circuit 100 will be described below in detail with reference to FIG. 3. The variable delay control circuit 100 includes a delay control value calculating circuit 110, a multiplier 120, and a counter circuit 121. The delay control value calculating circuit 110 includes an adder 111, a size comparator 113, selector circuits 115 and 116, and flip-flop circuits 117 and 118.

The counter circuit 121 stores a fixed decimal number having one place of decimals, and, based on a phase comparison result (UP/DOWN) between the input clock signal CKI and the output clock signal CKO given by the phase comparison result signal 301, counts up or down the stored fixed decimal number to output the stored fixed decimal number as a delay reference value 132.

The multiplier 120 multiplies the delay calculation value correction value 131 by the delay reference value 132 and outputs a value obtained by omitting decimals of a multiplication result as the variable delay control signal 101.

The flip-flop circuits 117 and 118 and the counter circuit 121 operate based on a timing of a leading edge of the input clock signal CKI (illustration of the input clock signal CKI is omitted in FIG. 3 for simplification).

An operation of the variable delay control circuit 100 will be described below with reference to FIG. 4. FIG. 4 is a timing chart showing an operation of the variable delay control circuit 100 when a dividing ratio N/M=5/8. In FIG. 4, the input clock signal CKI, the output clock signal CKO, a delay calculation value 130 which is an output from the adder 111, the delay calculation value correction value 131 which is an output from the selector circuit 116, the delay reference value 132 which is an output from the counter circuit 121, the variable delay control signal 101 which is an output from the multiplier 120, and a phase comparison result signal 301 which is an output from the phase comparator 300 are shown.

The variable delay control circuit 100 is set in an in-initialization state immediately after a reset operation or immediately after the dividing ratio changes. The variable delay control circuit 100, in the in-initialization state, performs an operation which calculates a delay control value which controls a delay amount of the variable delay circuit 200 to be a delay amount for one cycle of the input clock signal CKI.

The selector circuit 116 selects an input N=5 as the delay calculation value correction value 131 to output the delay calculation value correction value 131 when initialization information INI expressing an in-initialization state is given. An initial value of the value stored in the counter circuit 121 is 1.0. For example, in a cycle in which the delay calculation value correction value 131 is 5 and the delay reference value 132 is 1.0, the variable delay control signal 101 is 5, and the variable delay circuit 200 outputs the output clock signal CKO at a delay corresponding to delay control value=5.

The phase comparator 300 compares a leading edge of the output clock signal CKO with a next leading edge of the input clock signal CKI. Since the leading edge of the output clock signal CKO has a phase delayed from the next leading edge of the input clock signal CKI, an UP request is output to the phase comparison result signal 301. When the counter circuit 121 receives the UP request from the phase comparison result signal 301 to be input, the stored fixed decimal number 1.0 is counted up to 1.1.

Similarly, the value stored by the counter circuit 121 is counted up until the phase of the leading edge of the output clock signal CKO and the phase of the next leading edge of the input clock signal CKI are equal to each other. In accordance with this, the value of the variable delay control signal 101 and a delay amount of the variable delay circuit 200 gradually increase.

When the value of the delay reference value 132 reaches 20.0, and when the value of the variable delay control signal 101 reaches 100, it is assumed that the phase of the leading edge of the output clock signal CKO and the phase of the next leading edge of the input clock signal CKI are equal to each other. At this time, the phase comparator 300 detects a lock without outputting an UP request to the phase comparison result signal 301. In the counter circuit 121, a value (=20.0) corresponding to 1/N (=1/5) of a delay control value (=100) which controls a delay amount of the variable delay circuit 200 to be a delay amount for one cycle of the input clock signal CKI is stored.

When the lock is detected, the variable delay control circuit 100 performs transition from an in-initialization state to a diving operation state. The variable delay control circuit 100, in the dividing operation state, outputs the variable delay control signal 101 which controls a delay amount of the variable delay circuit 200 to generate the output clock signal CKO obtained by dividing the input clock signal CKI at a dividing ratio N/M=5/8.

Details of an operation in the dividing operation state of the variable delay control circuit 100 will be described below with reference to FIG. 4 again. In FIG. 4, in cycle 0 in the dividing operation state, it is assumed that the value of the delay calculation value 130 is 0.

In the dividing operation state, the selector circuit 116 refers to a comparison result between the delay calculation value 130 obtained by the size comparator 113 and N. When the delay calculation value 130 is N or more, a value of 0 is selected. When the delay calculation value 130 is less than N, the delay calculation value 130 is selected and output as the delay calculation value correction value 131.

In cycle 0, since the selector circuit 116 selects a value of 0 as the delay calculation value 130, the value of the delay calculation value correction value 131 is 0. The value of the delay reference value 132 is the value of 20.0 stored in the counter circuit 121. The value of 20.0 is a value corresponding to 1/N (N=5) of 100 which is a delay control value for controlling the delay amount of the variable delay circuit 200 to be a delay amount for one cycle of the input clock signal CKI. Therefore, the value of the variable delay control signal 101 becomes 0, and the variable delay circuit 200 does not output the output clock signal CKO.

In cycle 1, the flip-flop 117 holds a result of the size comparator 113 in cycle 0, i.e., that the delay calculation value 130 is less than N. The selector circuit 115 refers to a result of the size comparator 113 of the previous cycle held in the flip-flop 117. When the delay calculation value 130 is N or more, an input "−N" is selected. When the delay calculation value 130 is less than N, an input "M−N" is selected. Therefore, in cycle 1, the selector circuit 115 selects an input "M−N"=8−5=3.

The flip-flop circuits 118 holds a value of 0 of the delay calculation value 130 in cycle 0. Therefore, the value of the delay calculation value 130 is an output 0+3=3 of the adder 111. Since a value of 3 of the delay calculation value 130 is less than N (N=5), the selector circuit 116 selects the value of 3 of the delay calculation value 130, and the value of the delay calculation value correction value 131 is 3. Therefore, the value of the variable delay control signal 101 is 3 ×20.0=60.

The variable delay circuit 200 outputs the output clock signal CKO subjected to delay corresponding to 60 which is a delay control value to the input clock signal CKI. Since the delay amount of the variable delay circuit 200 is equal to a delay amount for one cycle of the input clock signal CKI when the delay control value is 100, as shown in FIG. 4, a delay amount is 60/100=3/5 of one cycle when the delay control value is 60.

In cycle 2, the flip-flop 117 holds that the delay calculation value 130 is less than N in cycle 1. Therefore, the selector circuit 115 selects and outputs an input "M–N"=3. The flip-flop circuit 118 holds a value of 3 of the delay calculation value 130 in cycle 1. Therefore, the value of the delay calculation value 130 is 3+3=6 which is an addition result of the adder 111. Since the value of 6 of the delay calculation value 130 is N (N=5) or more, the selector circuit 116 selects a value of 0, and the value of the delay calculation value correction value 131 is 0. Therefore, the value of the variable delay control signal 101 is 0×20.0=0, and the variable delay circuit 200 does not output the output clock signal CKO.

In cycle 3, the flip-flop 117 holds that the value of the delay calculation value 130 is N or more in cycle 2. Therefore, the selector circuit 115 selects and output an input "–N"=–5. The flip-flop circuits 118 holds a value of 6 of the delay calculation value 130 in cycle 2. Therefore, the value of the delay calculation value 130 is 6–5=1 which is an addition result of the adder 111. Since the value of 1 of the delay calculation value 130 is less than N (N=5), the selector circuit 116 selects the value of 1 of the delay calculation value 130 and the value of the delay calculation value correction value 131 is 1. Therefore, the value of variable delay control signal 101 is 1×20.0=20, and the variable delay circuit 200 outputs the output clock signal CKO obtained by delaying the input clock signal CKI by a delay amount corresponding to 20 which is the delay control value. Since the delay amount of the variable delay circuit 200 is equal to a delay amount for one cycle of the input clock signal CKI when the delay control value is 100, when the delay control value is 20, as shown in FIG. 4, the delay amount is 20/100=1/5=1/N of one cycle of the input clock signal CKI.

Similarly, in cycle 4, the value of the delay calculation value 130 is 1+3=4, the delay calculation value correction value 131 is 4, and the value of the variable delay control signal 101 is 80. Therefore, the output clock signal CKO obtained by delaying the input clock signal CKI by 80/100=4/5=4/N of one cycle of the input clock signal CKI is output.

In cycle 5, the value of the delay calculation value 130 is 4+3=7, the value of the delay calculation value correction value 131 is 0, and the value of the variable delay control signal 101 is 0. Therefore, the output clock signal CKO is not output.

Furthermore, in cycle 6, the value of the delay calculation value 130 is 7–5=2, the value of the delay calculation value correction value 131 is 2, and the value of the variable delay control signal 101 is 40. Therefore, the output clock signal CKO obtained by delaying the input clock signal CKI by 40/100=2/5=2/N of one cycle of the input clock signal CKI.

Furthermore, in cycle 7, the value of the delay calculation value 130 is 2+3=5, the value of the delay calculation value correction value 131 is 5, and the value of the variable delay control signal 101 is 100. Therefore, the output clock signal CKO obtained by delaying the input clock signal CKI by one cycle of the input clock signal CKI is output. More specifically, the phase of the leading edge of the output clock signal CKO is equal to the phase of the next leading edge of the input clock signal CKI.

In cycle 0 next to cycle 7, the flip-flop 117 holds that the delay calculation value 130 is N or more in cycle 7. Therefore, the selector circuit 115 selects and outputs an input "–N"=–5. The flip-flop circuit 118 holds a value of 5 of the delay calculation value 130 in cycle 7. Therefore, the value of the delay calculation value 130 is 5–5=0 of the adder 111. Since the value of 0 of the delay calculation value 130 is less than N (N=5), the selector circuit 116 selects a value of 0, and the value of the delay calculation value correction value 131 is 0. Therefore, the value of the variable delay control signal 101 is 0×20.0=0, and the variable delay circuit 200 does not output the output clock signal CKO. This status is the same as that in cycle 0 described above.

Thereafter, an operation from cycle 0 to cycle 7 is repeated.

As described above, when the variable delay control circuit 100 is set in an in-initialization state, the phase comparator 300 compares phase differences between the leading edges of the input clock signals CKI and the output clock signals CKO every cycle of the input clock signal CKI and outputs a result as the phase comparison result signal 301. When the variable delay control circuit 100 is in a dividing operation state, as is apparent from FIG. 4, the phase of the leading edge of the input clock signal CKI is equal to that of the leading edge of the output clock signal CKO.

When the variable delay control circuit 100 is a dividing operation state, the phase comparator 300 periodically compares phase differences of the leading edges of the input clock signals CKI and the output clock signals CKO at a timing of cycle 0 and outputs a comparison result as the phase comparison result signal 301. At this time, when the phase of the output clock signal is delayed with reference to the phase of the input clock signal CKI, an UP request is output to the phase comparison result signal 301. When the phase of the output clock signal advances with reference to the phase of the input clock signal CKI, a DOWN request is output to the phase comparison result signal 301. In this manner, even though a delay amount of the variable delay circuit 200 fluctuates due to a variation in temperature, a variation in power supply voltage, or the like, the delay reference value 132 is adjusted based on the phase comparison result output from the phase comparator 300. For this reason, an operation is performed such that the phase of the input clock signal CKI and the phase of the output clock signal CKO are always equal to each other at a timing of cycle 0. More specifically, as also shown in FIG. 4, a cycle time (interval between leading edges) of the output clock signal CKO is constantly determined to be 1/N×M=M/N=8/5 times of the cycle time of the input clock signal CKI.

Details of a configuration of the variable delay circuit 200 will be described below with reference to FIG. 2. The variable delay circuit 200 has a configuration in which a plurality of delay units 201 are connected in series with each other. More specifically, n delay units 201 of D1, D2, . . . , Dn (n is a positive integer number) are connected in series with each other from the left.

The input clock signal CKI is input to the delay unit 201 of D1 to be propagated to the right, is reflected by any one of the delay units 201 to be propagated to the left, passes through the delay unit 201 of D1 again, and is finally output as the output clock signal CKO through an inverter circuit 230. By the selection of the reflecting delay unit 201, the number of stages of the delay unit 201 through which the input clock signal CKI passes can be controlled to cause the variable delay circuit 200 to realize variable delays.

The delay units 201 include AND circuits 205 and 207 and a NAND circuit 206. The AND circuit 205 controls, based on an input mask signal 210, whether the input clock signal CKI propagated from left to right in FIG. 2 is input to the delay units 201. The NAND circuit 206 functions as a bypass circuit which controls, based on the reflected control signal 211, whether the input clock signal CKI propagating from left to right in FIG. 2 is reflected to the left again and output in each of the delay units 201. The AND circuit 207 outputs the clock signal passing through the NAND circuit 206 and reflected or a clock signal propagated from the delay unit 201 adjacent to the right to the delay unit 201 adjacent to the left. In this manner, the AND circuits 205 and 207 mainly function as delay elements which generate delays.

A decode circuit 220 decodes a delay control value given by the variable delay control signal 101 to generate a reflected control signal 211 of each of the delay units 201. A signal obtained by logically inverting the reflected control signal 211 by an inverter circuit 221 is used as the input mask signal 210.

Referring to FIGS. 5 and 6, details of an operation of the variable delay circuit 200 will be described below. FIG. 5 is a timing chart showing an operation of the variable delay control circuit 100 when a dividing ratio is N/M=3/4. In this case, when a delay control value which controls a delay amount of the variable delay circuit 200 to be a delay amount for one cycle of the input clock signal CKI is 12, the value of the delay reference value 132 is set to 12/N=12/3=4.

In cycle 0, the value of the delay calculation value 130 is 4, the value of the delay calculation value correction value 131 is 0, and the value of the variable delay control signal 101 is 0. In cycle 1, the value of the delay calculation value 130 is 1, the value of the delay calculation value correction value 131 is 1, and the value of the variable delay control signal 101 is 4. In cycle 2, the value of the delay calculation value 130 is 2, the value of the delay calculation value correction value 131 is 2, and the value of the variable delay control signal 101 is 8. In cycle 3, the value of the delay calculation value 130 is 3, the value of the delay calculation value correction value 131 is 3, and the value of the variable delay control signal 101 is 12. In this manner, when the dividing ratio N/M=3/4, the operations in cycle 0 to cycle 3 are repeated to realize frequency division.

FIG. 6 is a pattern diagram showing a manner of propagation of a leading edge and a trailing edge of the input clock signal CKI in the variable delay circuit 200 in each of cycle 0 to cycle 3. FIG. 6 shows values of the input mask signal 210, the reflected control signal 211, a forward output signal 212, and a backward output signal 213 in the 16 delay units 201 of D1 to D16.

In cycle 0, since the value of the variable delay control signal 101 is 0, the decode circuit 220 outputs only the leftmost reflected control signal 211 (to which no delay unit 201 is connected) in FIG. 4 as a value of 1, and outputs the values of the other reflected control signals 211 as a value of 0. Therefore, since the value of the input mask signal 210 of the delay unit of D1 is 0, propagation of the input clock signal CKI is masked in the delay unit of D1, and the output clock signal CKO is not output.

In cycle 1, since the value of the variable delay control signal 101 is 4, the decode circuit 220 outputs only the reflected control signal 211 of the delay unit of D4 as 1 and outputs the values of the other reflected control signals 211 as 0. Therefore, both the leading and trailing edges of the input clock signal CKI are reflected by the delay unit of D4 and propagated. More specifically, as the output clock signal CKO, a clock signal obtained by delaying the input clock signal CKI by a delay corresponding to a delay for the four delay units 201 is output. Since the value of the input mask signal 210 of the delay unit 201 of D5 is 0, the input clock signal CKI is not propagated to the right of the delay unit of D5.

In cycle 2, since the value of the variable delay control signal 101 is 8, the decode circuit 220 outputs only the reflected control signal 211 of the delay unit of D8 as a value of 1 and outputs the values of the other reflected control signals 211 as 0. Therefore, both the leading and trailing edges of the input clock signal CKI are reflected by the delay unit of D8 and propagated. More specifically, as the output clock signal CKO, a clock signal obtained by delaying the input clock signal CKI by a delay corresponding to a delay for the eight delay units 201 is output. Since the value of the input mask signal 210 of the delay units of D9 201 is 0, the input clock signal CKI is not propagated to the right of the delay unit of D9.

Furthermore, in cycle 3, since the value of the variable delay control signal 101 is 12, the decode circuit 220 outputs only the reflected control signal 211 of the delay unit of D12 as a value of 1 and outputs the values of other reflected control signals 211 as 0. Therefore, both the leading and trailing edges of the input clock signal CKI are reflected by the delay unit of D12 and propagated. More specifically, as the output clock signal CKO, a clock signal obtained by delaying the input clock signal CKI by a delay corresponding to a delay for the 12 delay units 201 is output. This is equal to a cycle time of the input clock signal CKI. Since the value of the input mask signal 210 of the delay units of D13 201 is 0, the input clock signal CKI is not propagated to the right of the delay unit of D13.

Subsequently, the operations in cycle 0 to cycle 3 are repeated to make it possible to realize frequency division having a dividing ratio N/M=3/4. This is realized such that the variable delay control circuit 100 controls a delay amount of the variable delay circuit 200 every cycle of the input clock signal CKI in units of 1/N of one cycle of the input clock signal CKI.

As is apparent from FIG. 5, a cycle time (interval between leading edges) of the output clock signal CKO is constantly determined by 1/N×M=M/N=4/3 times of the cycle time of the input clock signal CKI.

In the embodiment the variable delay control circuit 100 inputs set signals M−N, −N, and N of a dividing ratio and uses the set signals. However, the set signals are not limited to the above set signals. For example, set signals M and N may be input, and set signals M−N and −N may be generated and used inside.

In the embodiment, the counter circuit 121 stores a value corresponding to 1/N of a delay control value which controls the delay amount of the variable delay circuit 200 to be a delay amount for one cycle of the input clock signal CKI. However, when the value is a value which can derive the delay control value which controls the delay amount to be the delay amount for one cycle of the input clock signal CKI, the value is not limited to the value described above. For example, when the delay control value itself which controls the delay amount to be the delay amount for one cycle of the input clock signal CKI is stored and used, the value of 1/N may be calculated.

As described above, in the clock signal dividing circuit according to the embodiment, the variable delay circuit 200 is appropriately controlled to generate an edge at a timing except for the edge of the input clock signal CKI. For this reason, a rational number divided clock signal having a constant cycle time can be generated.

In the clock signal dividing circuit according to the embodiment, even in a diving operation state, phase comparison between the input clock signal CKI and the output clock signal CKO and adjustment of the delay reference value 132 are periodically performed. For this reason, even though a fluctuation in temperature, even though a fluctuation in power supply voltage, or the like occur, in accordance with the fluctuations, a rational number divided clock signal having a constant cycle time can be generated.

Furthermore, the variable delay circuit 200 is configured by only a digital logical circuit, and determines a delay amount based on a digital value output from the variable delay control circuit 100. In comparison with realization by a conventional phase interpolator, even though a clock having a relatively low frequency is generated, a large capacity is not required. For this reason, a power consumption and a layout area are small.

Furthermore, since an analog circuit and a circuit which requires single-purpose design are not used, a design/verification cost is small.

The variable delay circuit 200 does not operate in a delay unit which is a subsequent stage to the delay unit which reflects the input clock signal CKI. More specifically, since only delay units required for generation of a delay operate, a low power consumption can be obtained.

Furthermore, the variable delay control circuit 100 cumulatively adds values M−N every cycle. When the addition result is larger than N, an operation which subtracts N from the addition result is performed. For this reason, the addition result can be directly used as a control signal of the variable delay circuit.

Second Exemplary Embodiment

In the description in the first exemplary embodiment, when a dividing ratio is N/M, a divided clock signal having a constant cycle time which is M/N times of a cycle time of the input clock signal CKI can be generated. However, in the first exemplary embodiment, for example, even though a duty ratio of the input clock signal CKI is 50%, it is not assured that the duty ratio of the output clock signal CKO is 50%. The duty ratio mentioned here is a ratio of a high-level period (period in which a value is 1) or a low-level period (period in which a value is 0) of a clock signal to a cycle time. In general, as the duty ratio of a clock signal, 50% is frequently desirable. In this embodiment, a method of generating an output clock signal having a duty ratio of 50% will be described below. The same reference numerals as in the configuration in the first exemplary embodiment denote the same part in the second exemplary embodiment and detail descriptions will be omitted.

FIG. 7 is a block diagram showing a configuration of a clock signal dividing circuit according to the second exemplary embodiment of the present invention. In FIG. 7, the clock signal dividing circuit includes a variable delay control circuit 150, a variable delay circuit 250, and a phase comparator 300, and divides the input clock signal CKI at a dividing ratio N/M (M and N are positive integers and satisfy M>N) to output the resultant clock signal as the output clock signal CKO.

The variable delay control circuit 150 operates at a timing of the input clock signal CKI and generates a leading delay control signal 151 and a trailing delay control signal 152 with reference to set signals M−N, −N, and N of the dividing ratio and a phase comparison result signal 301. More specifically, the set signals M−N, −N, and N of the dividing ratio are input to calculate a leading delay control value and a trailing delay control value of the variable delay circuit in each cycle of the input clock signal CKI.

The variable delay circuit 250 adds delays of delay amounts which are in proportion to delay control values given by a leading delay control signal 151 and a trailing delay control signal 152 to leading and trailing edges of the input clock signal CKI, respectively, to output the resultant signals as output clock signals CKO. When the delay control value is 0, the output clock signal CKO is not output.

Details of a configuration of the variable delay control circuit 150 will be described below with reference to FIG. 8. The delay control value calculating circuit 110, the multiplier 120, and the counter circuit 121 are the same as those in the variable delay control circuit 100 in the first exemplary embodiment. In addition to these, a trailing delay correcting circuit 140 is added to the output of the multiplier 120. An output from the multiplier 120 is output to the variable delay circuit 250 as the leading delay control signal 151, and an output from the trailing delay correcting circuit 140 is output to the variable delay circuit 250 as the trailing delay control signal 152.

The trailing delay correcting circuit 140 includes an adder 141, a ½ multiplier 142, and a flip-flop 143. The ½ multiplier 142 calculates a value which is ½ of the value of the leading delay control signal 151 in cycle 1. The flip-flop 143 stores a calculation result of the ½ multiplier 142. The adder 141 adds a value which is ½ of the value of the leading delay control signal 151 in cycle 1 stored in the flip-flop 143 to the value of the leading delay control signal 151 to output the addition value as the trailing delay control signal 152.

Details of a configuration of the variable delay circuit 250 will be described below with reference to FIG. 9. The variable delay circuit 250 has a configuration in which a plurality of delay units 251 are connected in series with each other. More specifically, n delay units 251 of D1, D2, ..., Dn (n is a positive integer number) are connected in series with each other from the left in FIG. 9.

The input clock signal CKI is input to the delay unit 251 of D1 to be propagated to the right, is reflected by any one of the delay units 251 to be propagated to the left, passes through the delay unit 251 of D1 again, and is finally output as the output clock signal CKO through an inverter circuit 230. By the selection of the reflecting delay unit 251, the number of stages of the delay unit 251 through which the input clock signal CKI passes can be controlled to cause the variable delay circuit 250 to realize variable delays.

The delay units 251 include AND circuits 255 and 257 and a NAND circuit 256. The delay unit 251 is different from the delay units 201 in the first exemplary embodiment in that the NAND circuit 256 is configured by three inputs and refers a backward output signal 263 from the delay unit 251 adjacent to the right.

A leading delay decode circuit 270 decodes a leading delay control value given by the leading delay control signal 151 to generate a reflected control signal at a leading edge of each of the delay units 251. A trailing delay decode circuit 271 decodes a trailing delay control value given by the trailing delay control signal 152 to generate a reflected control signal at a trailing edge of each of the delay units 251.

The logic operation OR between the reflected control signals generated by the leading delay decode circuit 270 and the trailing delay decode circuit 271 is calculated by each of OR circuits 273, and a resultant value is supplied to the NAND circuit 256 of each of the delay units 251 as a reflected control signal 261. A signal obtained by logically inverting a reflected control signal at a trailing edge output from the trailing delay decode circuit 271 by an inverter circuit 272 is supplied to the AND circuit 255 of each of the delay units 251.

Referring to FIGS. 10 and 11, details of an operation of the variable delay circuit 250 will be described below. FIG. 10 is a timing chart showing an operation of the variable delay control circuit 150 when a dividing ratio is N/M=3/4. In this case, when a delay control value which controls a delay amount of the variable delay circuit 250 to be a delay amount for one cycle of the input clock signal CKI is 12, the value of the delay reference value 132 is set to 12/N=12/3=4. As will be described later, since the value of the leading delay control signal 151 in cycle 1 is 4, 2 which is ½ of the value of the leading delay control signal 151 is stored in the flip-flop 143.

In cycle 0, the value of the delay calculation value 130 is 4, the value of the delay calculation value correction value 131 is 0, the value of the leading delay control signal 151 is 0, and the value of the trailing delay control signal 152 is 2. In cycle 1, the value of the delay calculation value 130 is 1, the value of the delay calculation value correction value 131 is 1, the value of the leading delay control signal 151 is 4, and the value of the trailing delay control signal 152 is 6. In cycle 2, the value of the delay calculation value 130 is 2, the value of the delay calculation value correction value 131 is 2, the value of the leading delay control signal 151 is 8 and the value of the trailing delay control signal 152 is 10. In cycle 3, the value of the delay calculation value 130 is 3, the value of the delay calculation value correction value 131 is 3, the value of the leading delay control signal 151 is 12, and the value of the trailing delay control signal 152 is 14. In this manner, when the dividing ratio N/M=3/4, the operations in cycle 0 to cycle 3 are repeated to realize frequency division.

FIG. 11 is a pattern diagram showing a manner of propagation of a leading edge and a trailing edge of the input clock signal CKI in the variable delay circuit 250 in each of cycle 0 to cycle 3. FIG. 11 shows values of the input mask signal 260, the reflected control signal 261, a forward output signal 262, and a backward output signal 263 in the 16 delay units 251 of D1 to D16.

In cycle 0, since the value of the leading delay control signal 151 is 0, the leading delay decode circuit 270 outputs only the leftmost reflected control signal (to which no delay unit 251 is connected) in FIG. 9 as a value of 1, and outputs the values of the other reflected control signals 261 as 0. Therefore, since the value of the input mask signal 260 of the delay unit of D1 is 0, propagation of the input clock signal CKI is masked in the delay unit of D1, and the output clock signal CKO is not output.

In cycle 1, since the value of the leading delay control signal 151 is 4, the leading delay decode circuit 270 outputs only the reflected control signal of the delay unit of D4 as a value of 1 and outputs the values of the other reflected control signals as 0. On the other hand, the trailing delay decode circuit 271 outputs only the reflected control signal of the delay unit of D6 as a value of 1, and outputs the values of the other reflected control signals as 0.

In leading propagation of the input clock signal CKI, the value of the backward output signal 263 input to the NAND circuit 256 of the delay unit of D4 is 1. For this reason, transition of a leading edge passes through the NAND circuit 256 of the delay unit of D4. More specifically, the leading edge of the input clock signal CKI is reflected by the delay unit of D4 and propagated. More specifically, as the output clock signal CKO, a signal obtained by delaying the leading edge of the input clock signal CKI by a delay corresponding to a delay for the four delay units 251 is output. At the same time, the leading edge of the input clock signal CKI is reflected by the delay unit of D6 and propagated. However, the backward output signals 263 of the delay units D1 to D4 transit from a value of 1 to a value of 0 in advance by the reflection of the delay unit of D4. For this reason, transition of the leading edge is not propagated after the signal reaches the delay unit of D4. Since the value of the input mask signal 260 of the delay unit 251 of D7 is 0, the input clock signal CKI is not propagated to the right of the delay unit of D7.

In trailing propagation of the input clock signal CKI, since the value of the backward output signal 263 input to the NAND circuit 256 of the delay unit of D4 is 0, transition of a trailing edge does not pass through the NAND circuit 256 of the delay unit of D4. On the other hand, the transition is reflected by the delay unit of D6 and propagated. More specifically, as the output clock signal CKO, a signal obtained by delaying the trailing edge of the input clock signal CKI by a delay for the six delay units 251 is output.

Similarly, in cycle 2, a leading edge of the input clock signal CKI is reflected by the delay unit of D8, and a trailing edge of the input clock signal CKI is reflected by the delay unit of D10. More specifically, as the output clock signal CKO, a signal obtained by delaying the leading edge of the input clock signal CKI by a delay for the eight delay units 251 is output, and a signal obtained by delaying the input trailing edge of the clock signal CKI by a delay for the ten delay units 251 is output.

In cycle 3, a leading edge of the input clock signal CKI is reflected by the delay unit of D12, and a trailing edge of the input clock signal CKI is reflected by the delay unit of D14. More specifically, as the output clock signal CKO, a signal obtained by delaying the leading edge of the input clock signal CKI by a delay for the 12 delay units 251 is output. This is equal to a cycle time of the input clock signal CKI. Furthermore, a signal obtained by delaying the trailing edge of the input clock signal CKI by a delay for the 14 delay units 251 is output.

Subsequently, the operations in cycle 0 to cycle 3 are repeated to realize frequency division having a dividing ratio N/M=3/4. At this time, a cycle time (interval between leading edges) of the output clock signal CKO is constantly determined to be 1/N×M=M/N=4/3 times of the cycle time of the input clock signal CKI.

In the embodiment, as is apparent from FIG. 10, since different delays are appropriately added to the leading edge and the trailing edge of the input clock signal CKI, a characteristic feature in which the duty ratio of the output clock signal CKO is 50% when the duty ratio of the input clock signal CKI is 50% is obtained.

As described above, in the clock signal dividing circuit according to the embodiment, the variable delay circuit 250 is appropriately controlled to generate an edge at a timing except for an edge of the input clock signal CKI. For this reason, a rational number divided clock signal having a constant cycle time and a constant duty ratio can be generated.

In the variable delay circuit 250 according to the embodiment, different delays can be set to the leading and trailing edges, respectively. However, the delay control signal may be set once at most every cycle. For this reason, a characteristic feature in which a variable delay circuit according to the embodiment can easily design timings is obtained.

This application is based upon and claims the benefit of priority from Japanese patent application No. 2006-305075, filed on Nov. 10, 2006, the disclosure of which is incorporated herein in its entirety by reference.

BRIEF DESCRIPTION OF THE DRAWINGS

FIG. 1 is a block diagram showing a configuration of a clock signal dividing circuit according to a first exemplary embodiment of the present invention;

FIG. 3 is a circuit diagram of a variable delay control circuit according to the first exemplary embodiment of the present invention;

FIG. 5 is a second timing chart showing an operation of the variable delay control circuit according to the first exemplary embodiment of the present invention;

FIG. 7 is a block diagram showing a configuration of a clock signal dividing circuit according to a second exemplary embodiment of the present invention;

FIG. 8 is a circuit diagram of a variable delay control circuit according to the second exemplary embodiment of the present invention;

FIG. 10 is a timing chart showing an operation of the variable delay control circuit according to the second exemplary embodiment of the present invention;

Figure 2:
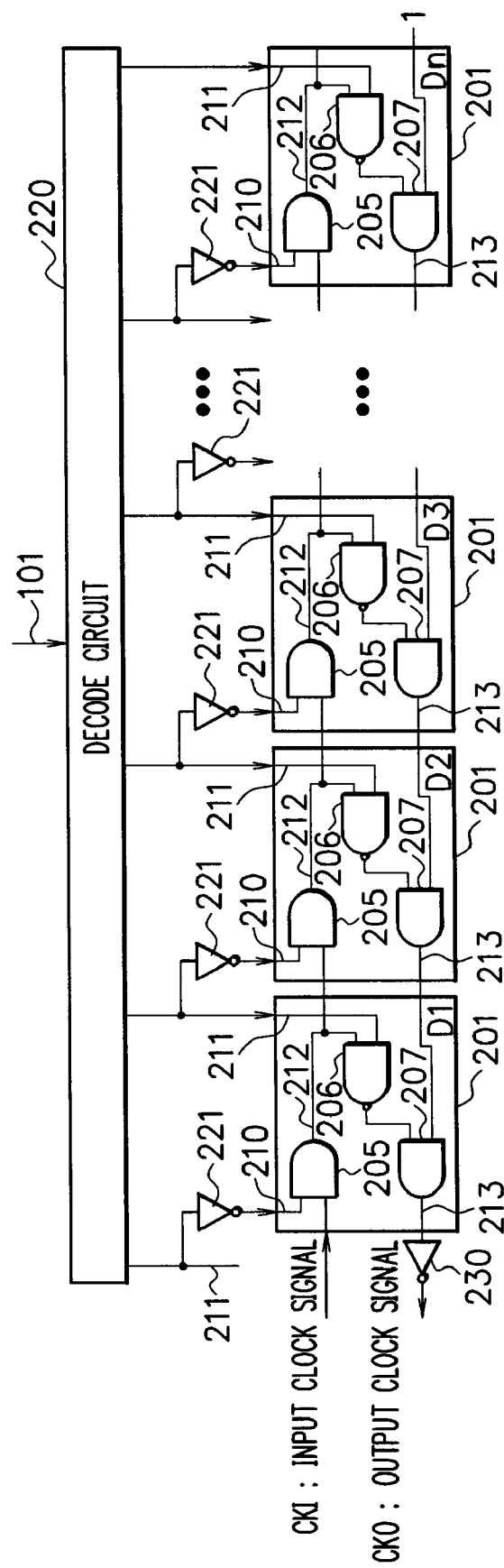
FIG. 2 is a circuit diagram of a variable delay circuit according to the first exemplary embodiment of the present invention.
Figure 4:
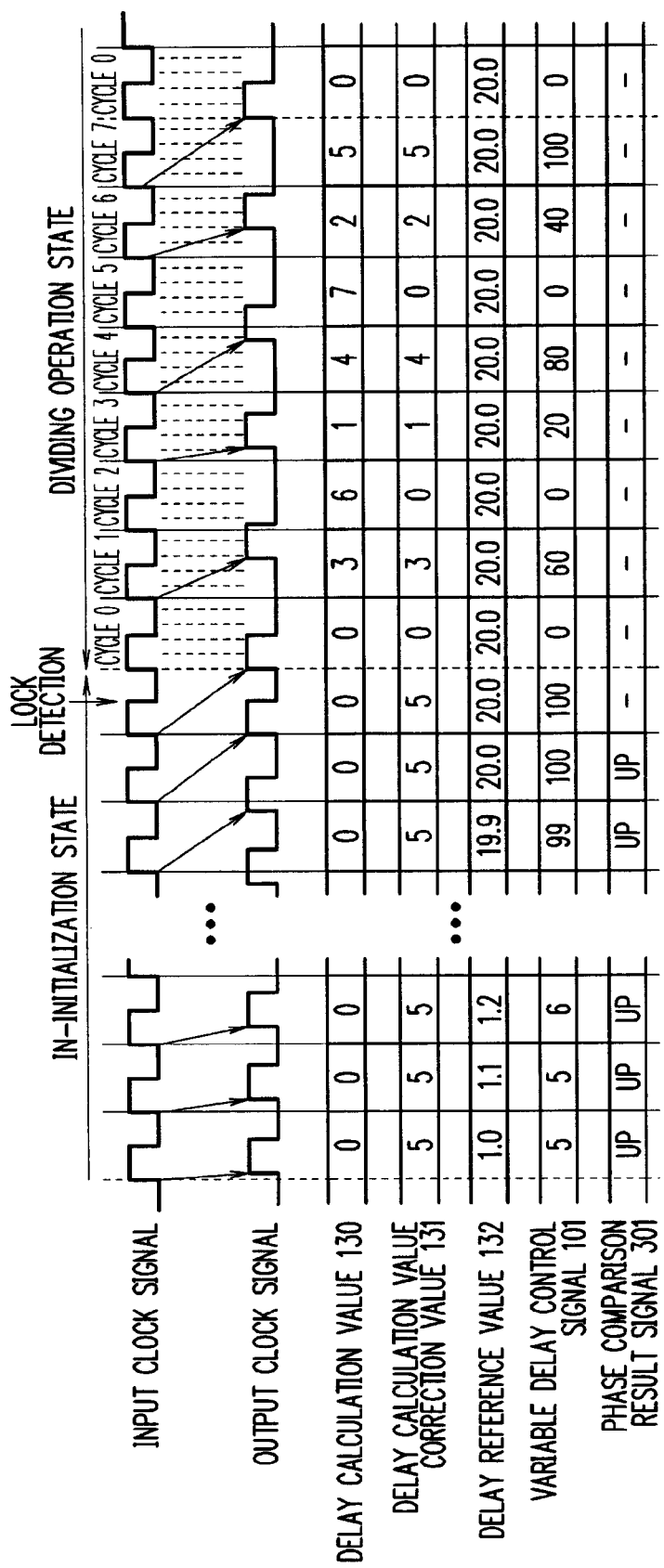
FIG. 4 is a first timing chart showing an operation of the variable delay control circuit according to the first exemplary embodiment of the present invention.
Figure 6B:
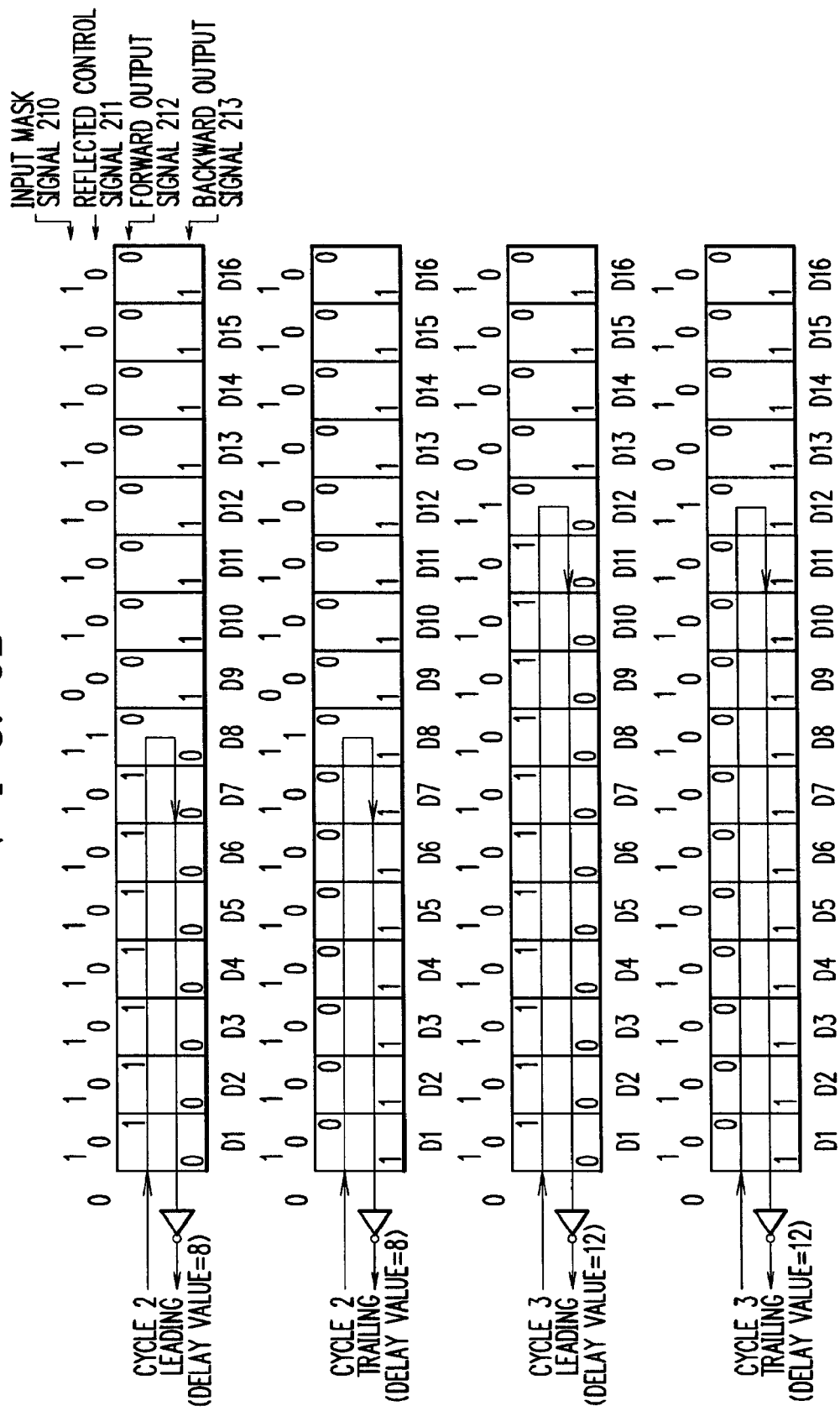
FIG. 6 is a pattern diagram showing an operation of the variable delay circuit according to the first exemplary embodiment of the present invention.
Figure 9:
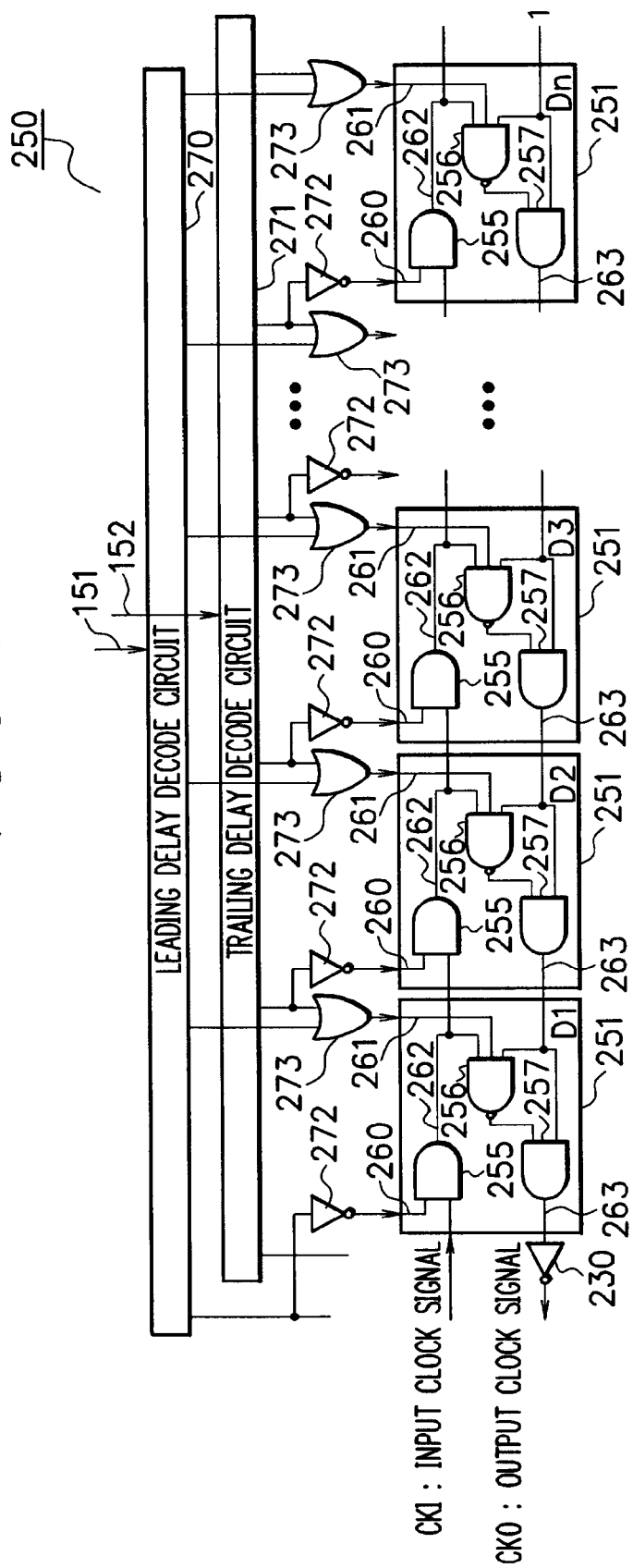
FIG. 9 is a circuit diagram of a variable delay control circuit according to the second exemplary embodiment of the present invention.
Figure 11A:
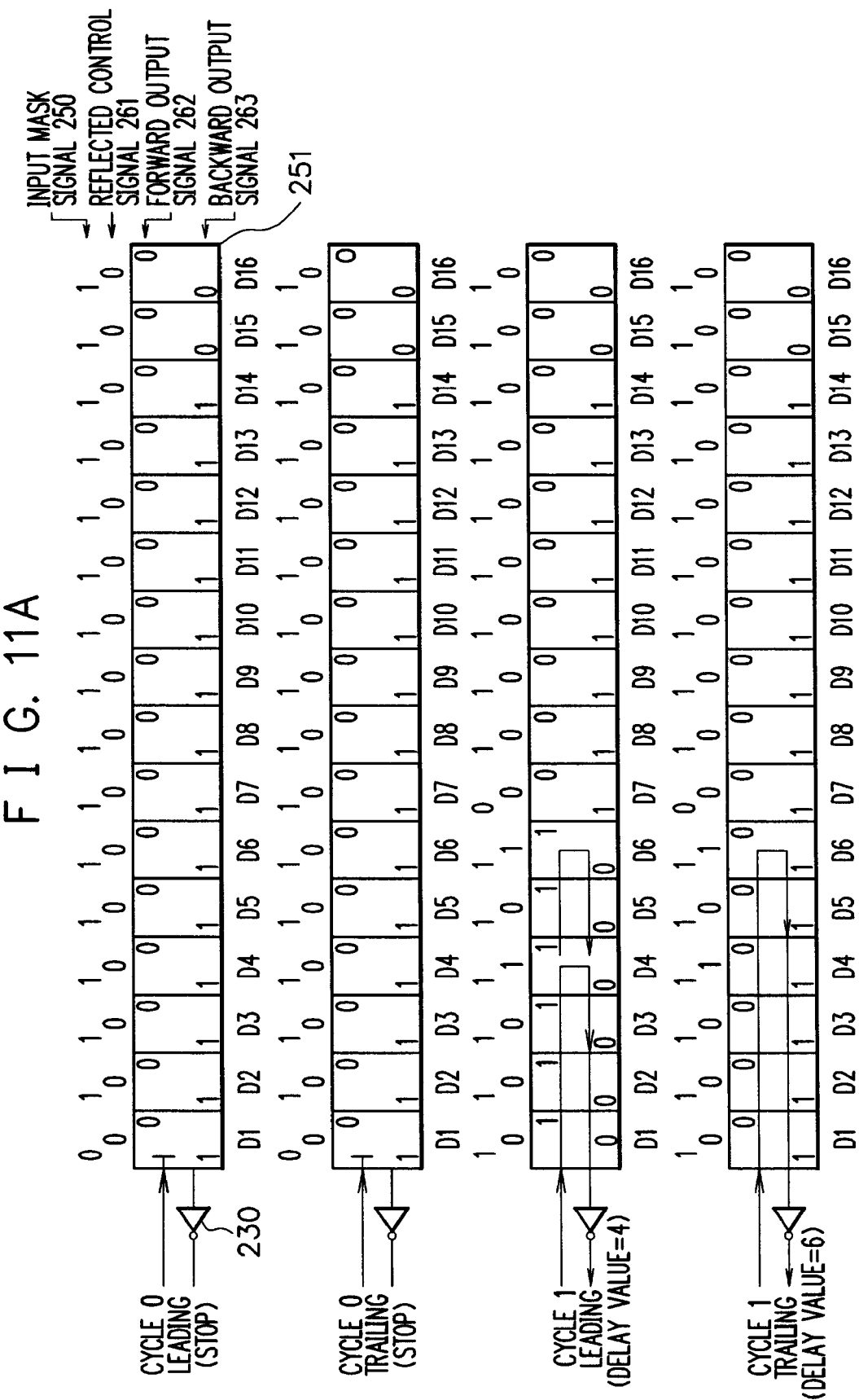
FIG. 11 is a pattern diagram showing an operation of the variable delay circuit according to the second exemplary embodiment of the present invention.

REFERENCE NUMERALS 100, 150: Variable delay control circuit
101: Variable delay control signal
110: Delay control value calculating circuit
111, 141: Adder
113: Size comparator
115, 116: Selector circuit
117, 118, 143: Flip-flop circuit
120: Multiplier
121: Counter circuit
130: Delay calculation value
131: Delay calculation value correction value
132: Delay reference value
140: Trailing delay correcting circuit
142: ½ multiplier
151: Leading delay control signal
152: Trailing delay control signal
200, 250: Variable delay circuit
201, 251: Delay unit
205, 207, 255, 257: AND circuit
206, 256: NAND circuit
210, 260: Input mask signal
211, 261: Reflected control signal
212, 262: Forward output signal
213, 263: Backward output signal
220: Decode circuit
221, 230, 272: Inverter circuit
270: Leading delay decode circuit
271: Trailing delay decode circuit
273: OR circuit
300: Phase comparator
301: Phase comparison result signal
CKI: Input clock signal
CKO: Output clock signal
INI: Initialization information

The invention claimed is:

1. A clock signal dividing circuit in which a dividing ratio is regulated by N/M (M and N are positive integers and satisfy M>N), comprising:
   a variable delay circuit which gives a predetermined delay amount based on a control value to an input clock signal to output an output clock signal; and
   a variable delay control circuit which cumulatively adds values obtained by subtracting N from M every cycle of the input clock signal, when the addition result is N or more, performs a calculation which subtracts N from the addition result to obtain a calculation result K, and calculates, to a maximum delay amount in the variable delay circuit corresponding to one cycle of the input clock signal, a control value corresponding to a delay amount of K/N of the maximum delay amount to give the control value to the variable delay circuit.

2. The clock signal dividing circuit according to claim 1, further comprising
   a phase comparator which compares a phase difference between the input clock signal and output clock signal, wherein
   the variable delay control circuit calculates the maximum delay amount based on a comparison result of the phase comparator in an initialization state to store the maximum delay amount.

3. The clock signal dividing circuit according to claim 2, wherein the variable delay control circuit periodically corrects a predetermined delay amount which is based on the control value based on the comparison result of the phase comparator in a frequency dividing operation state.

4. The clock signal dividing circuit according to claim 1, wherein
   the variable delay circuit includes a plurality of delay units, and the number of delay units through which the input clock signal passes is changed based on the control value to control the predetermined delay amount.

5. The clock signal dividing circuit according to claim 4, wherein
   the delay unit includes a first delay element which transmits the input clock signal in a forward direction, a second delay element which transmits the input clock signal in a backward direction, and a bypass circuit which makes an output from the first delay element connectable to an input of the second delay element, and
   the variable delay circuit activates only a bypass circuit included in a delay unit selected based on the control value.

6. The clock signal dividing circuit according to claim 5, wherein
   the variable delay circuit controls the first delay element included in a delay unit subsequent to the selected delay unit in the forward direction to be disconnected from a transmission route of the input clock signal.

7. The clock signal dividing circuit according to claim 1, wherein
   the variable delay circuit is a circuit which outputs an output clock signal by a logical operation between a first delay signal which gives a first delay amount based on a first control value to the input clock signal and a second delay signal which gives a second delay amount based on a second control value to the input clock signal,
   the first control value is a control value corresponding to a delay amount of K/N of the maximum delay amount, and
   the variable delay control circuit further includes a delay correction circuit which adds a predetermined value to the first control value to give an addition value to the variable delay circuit as the second control value.

8. The clock signal dividing circuit according to claim 7, wherein
the variable delay circuit includes a plurality of delay units, and the number of delay units through which the input clock signal passes is changed based on the first and second control values to control the first and second delay amounts.

9. The clock signal dividing circuit according to claim 8, wherein
the delay unit includes a first delay element which transmits the input clock signal in a forward direction, a second delay element which transmits the input clock signal in a backward direction, and a bypass circuit which makes an output of the first delay element connectable to an input of the second delay element, and
the variable delay circuit activates a bypass circuit included in the first delay unit selected based on the first control value and a bypass circuit included in the second delay unit selected based on the second control value and, at the input of the second delay element included in the first delay unit, performs the logical operation by an output from the bypass circuit included in the first delay unit and an output from the second delay element included in the delay unit located at a previous stage of the first delay unit in a backward direction.

10. The clock signal dividing circuit according to claim 9, wherein the variable delay circuit controls the first delay element included in the delay unit subsequent to the second delay unit in the forward direction to be disconnected from a transmission route of the input clock signal.

11. The clock signal dividing circuit according to claim 7, wherein
the predetermined value is a control value corresponding to a delay amount obtained by multiplying the maximum delay amount by $(M-N)/(2N)$.

12. The clock signal dividing circuit according to claim 7, wherein
the first control value is a control value to a first edge of the input clock signal, and
the second control value is a control value to a second edge opposing the first edge of the input clock signal.

* * * * *